United States Patent
Tsuji et al.

[11] Patent Number: 6,005,294
[45] Date of Patent: Dec. 21, 1999

[54] METHOD OF ARRANGING ALIGNMENT MARKS

[75] Inventors: Takaharu Tsuji; Mikio Asakura; Kyoji Yamasaki, all of Hyogo, Japan

[73] Assignee: Mitsubishi Denki Kabushiki Kaisha, Tokyo, Japan

[21] Appl. No.: 08/977,029

[22] Filed: Nov. 25, 1997

Related U.S. Application Data

[62] Division of application No. 08/759,199, Dec. 4, 1996, Pat. No. 5,716,889.

[30] Foreign Application Priority Data

May 29, 1996 [JP] Japan ................................. 8-134666

[51] Int. Cl.$^6$ ............................................. H01L 23/544
[52] U.S. Cl. .......................... 257/797; 257/620; 438/401; 438/462; 438/975
[58] Field of Search ...................... 257/797, 620; 438/401, 462, 975

[56] References Cited

U.S. PATENT DOCUMENTS

| | | | |
|---|---|---|---|
| 4,981,529 | 1/1991 | Tsujita | 148/33 |
| 5,684,333 | 11/1997 | Moriyama | 257/797 |
| 5,777,392 | 7/1998 | Fujii | 257/797 |

FOREIGN PATENT DOCUMENTS

| | | |
|---|---|---|
| 59-101829 | 6/1984 | Japan . |
| 63-285947 | 11/1988 | Japan . |
| 2-1110 | 1/1990 | Japan . |
| 6-349705 | 12/1994 | Japan . |

*Primary Examiner*—Mahshid Saadat
*Assistant Examiner*—Allan R. Wilson
*Attorney, Agent, or Firm*—McDermott, Will & Emery

[57] ABSTRACT

A shot region includes a device region for forming a semiconductor device therein and a dicing region used for dicing. A portion of the peripheral edge portion of the shot region is defined by a portion of the peripheral edge portion of the device region. An alignment mark is arranged within the device region, and additional alignment marks are arranged within the dicing region. Thus, the number of the devices manufactured per wafer can be increased without degrading precision of alignment.

9 Claims, 4 Drawing Sheets

METHOD OF ARRANGING ALIGNMENT MARKS

This application is a division of application Ser. No. 08/759,199 filed Dec. 4, 1996 now U.S. Pat. No. 5,716,889.

BACKGROUND OF THE INVENTION

1. Field of the Invention

The present invention relates to a method of arranging alignment marks. It particularly relates to a method of arranging alignment marks capable of reducing the region other than a device region for forming therein a semiconductor device by shifting the positions of a pair of adjacent alignment marks, in achieving highly precise alignment with the use of four alignment marks.

2. Description of the Background Art

Recently, in the exposure step of the process for manufacturing semiconductor memory devices or the like, alignment of a stepper has becomes important for precise fine-patterning process. While various stepper alignment methods have been conventionally proposed, an alignment method using four alignment marks is disclosed, for example, in Japanese Patent Laying-Open No. 6-349705. In achieving alignment using such four alignment marks, the four alignment marks are formed at positions which are in point symmetry with respect to the center of a shot region for the stepper. Then, the positions of the four alignment marks are detected to correct the offsets between the detected positions and the coordinates of preset positions. The alignment marks are preferably arranged at four corners of the shot region.

FIG. 4A shows an example of a conventional arrangement method for alignment marks 4a, 4b, 4c, and 4d. Referring to FIG. 4A, a dicing region 2 provided for dicing and a TEG (Test Element Group) region 5 are provided around a device region 3 for forming a semiconductor device therein. When the device region 3 is thus surrounded by dicing region 2 and TEG region 5, alignment marks 4a–4d are generally arranged within dicing region 2 or TEG region 5. Such provision of four alignment marks 4a–4d allows highly precise alignment as described above.

However, while highly precise alignment as described above is sought for, so is increase in the number of the devices manufactured per wafer. One technique for increasing the number of the devices manufactured per wafer is to reduce the region other than device region 3.

In FIG. 4B, TEG region 5 is simply removed in order to reduce the region other than device region 3. As shown in FIG. 4B, when TEG region 5 is simply removed, positions for forming alignment marks 4a and 4d are not ensured. Thus, it is not ensured that four alignment marks are provided within shot region 1, making it difficult to achieve precise alignment.

Thus, it has been difficult to increase the number of the devices manufactured per wafer without degrading precision of alignment.

SUMMARY OF THE INVENTION

The present invention is made to solve the problem described above. An object of the present invention is to provide a method of arranging alignment marks capable of increasing the number of the devices manufactured per wafer without degrading precision of alignment.

A method of arranging alignment marks according to one aspect of the present invention is assumed to be used for alignment of a stepper in an exposure step. Alignment marks are formed on a semiconductor wafer including a device region for forming a semiconductor device therein and a dicing region provided around the device region for dicing. The device region is arranged within one shot region such that a portion of its peripheral edge portion defines a portion of the peripheral edge portion of the shot region for a stepper. Then, a first alignment mark is arranged within the device region positioned within the shot region, and second, third and fourth alignment marks are arranged within the dicing region positioned within the shot region, spaced apart from one another.

Since the device region is thus arranged within the shot region such that a portion of the peripheral edge portion of the device region defines a portion of the peripheral edge portion of one shot region for the stepper, the region surrounding the device region can be reduced when compared with a conventional example shown in FIG. 4A. Furthermore, as the first alignment mark is arranged within the device region and the second, third, and fourth alignment marks are arranged within the dicing region, four alignment marks can be provided within one shot region, thus allowing highly precise alignment.

The shot region and the device region each have a quadrangular, planar shape, and the device region is preferably arranged such that two adjacent sides of the device region overlap adjacent first and second sides of the shot region, respectively. Furthermore, the first alignment mark is preferably arranged within the device region near a first corner of the shot region defined by the first and the second sides, and the dicing region preferably extends along sides other than the above two sides of the device region. Furthermore, the second, third and fourth alignment marks are preferably arranged within the dicing region near second, third and fourth corners of the shot region.

Furthermore, the first and third alignment marks are preferably arranged at positions which are in point symmetry with respect to the center of the shot region, and the second and fourth alignment marks are preferably arranged at portions which are in point symmetry with respect to the center of the shot region. Furthermore, the first and fourth alignment marks are preferably arranged such that an imaginary line segments joining the first and fourth alignment marks is generally parallel to the first side of the shot region and extends over the dicing region and the device region. Furthermore, the shot region preferably has a third side which is parallel to the first side, and the second and third alignment marks are preferably arranged such that an imaginary line segment joining the second and third alignment marks is generally parallel to the third side and extends only over the dicing region.

A method of arranging alignment marks according to another aspect of the present invention is assumed to be used for laser trimming. The alignment marks are formed on a semiconductor wafer including a device region for forming a semiconductor device therein and a dicing region provided around the device region for dicing. A plurality of regions each including the device region are provided adjacent to one another on the semiconductor wafer. The device region is arranged such that a portion of its peripheral edge portion defines a portion of the peripheral edge portion of each of the plurality of regions. A first alignment mark used for laser trimming is provided within a device region positioned within that one of the plurality of regions which is arranged at the very end and which has a device region therein not located adjacent to the dicing region within another region. Second, third and fourth alignment marks used for laser trimming are arranged, spaced apart from one another, within the dicing region within the region arranged at the very end.

As described above, according to the above another aspect, a first alignment mark is selectively provided within the device region only within a region arranged at the very end among a plurality of regions provided on a semiconductor wafer. For laser trimming, an alignment mark provided within an adjacent region can be used, since it is not necessary to take it into consideration that shot regions may not overlap each other as is in the above mentioned one aspect. Thus, basically it is not necessary to provide an additional alignment mark within a device region, even when the portion other than the device region is reduced as is in the above one aspect. However, for a region positioned at the very end, an alignment mark within an adjacent region is not always available. In this case, precision of alignment at the region positioned at the very end will be degraded. Thus, by selectively providing an alignment mark only within the device region in the region positioned at the very end, precision of alignment in laser trimming can be improved for all of the regions. In this aspect also, similar to the above mentioned one aspect, the number of the device manufactured per wafer can be increased.

The region and the device region each have a quadrangular, planar shape, and the device region is preferably arranged such that two adjacent sides of the device region overlap adjacent first and second sides of the region, respectively. Furthermore, the first alignment mark is preferably arranged within the device region near a first corner of the region defined by the first and second sides. Furthermore, the dicing region preferably extends along sides other than the above two sides of the device region, and the second, third and fourth alignment marks are preferably arranged within the dicing region near second, third and fourth corners of the region, respectively.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
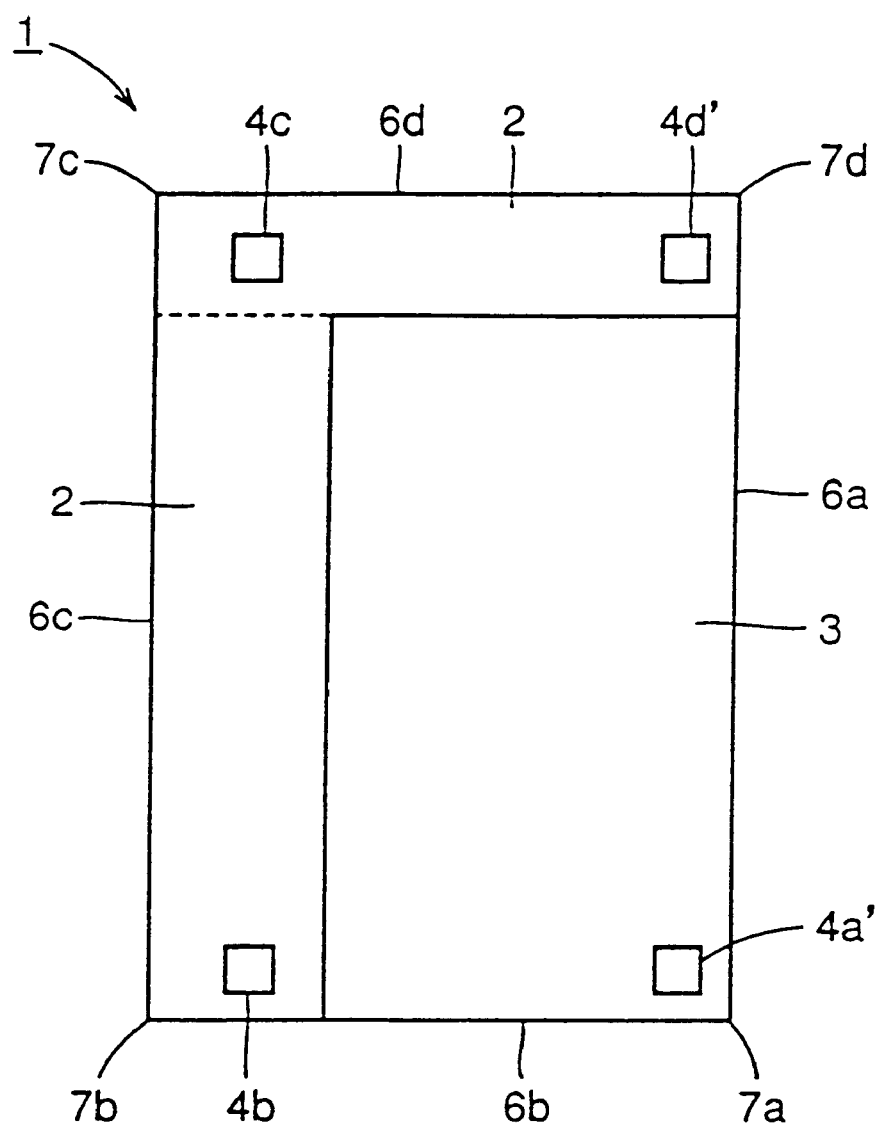
FIG. 1 is a plan view showing an arrangement of alignment marks according to a first embodiment of the present invention.
Figure 2:
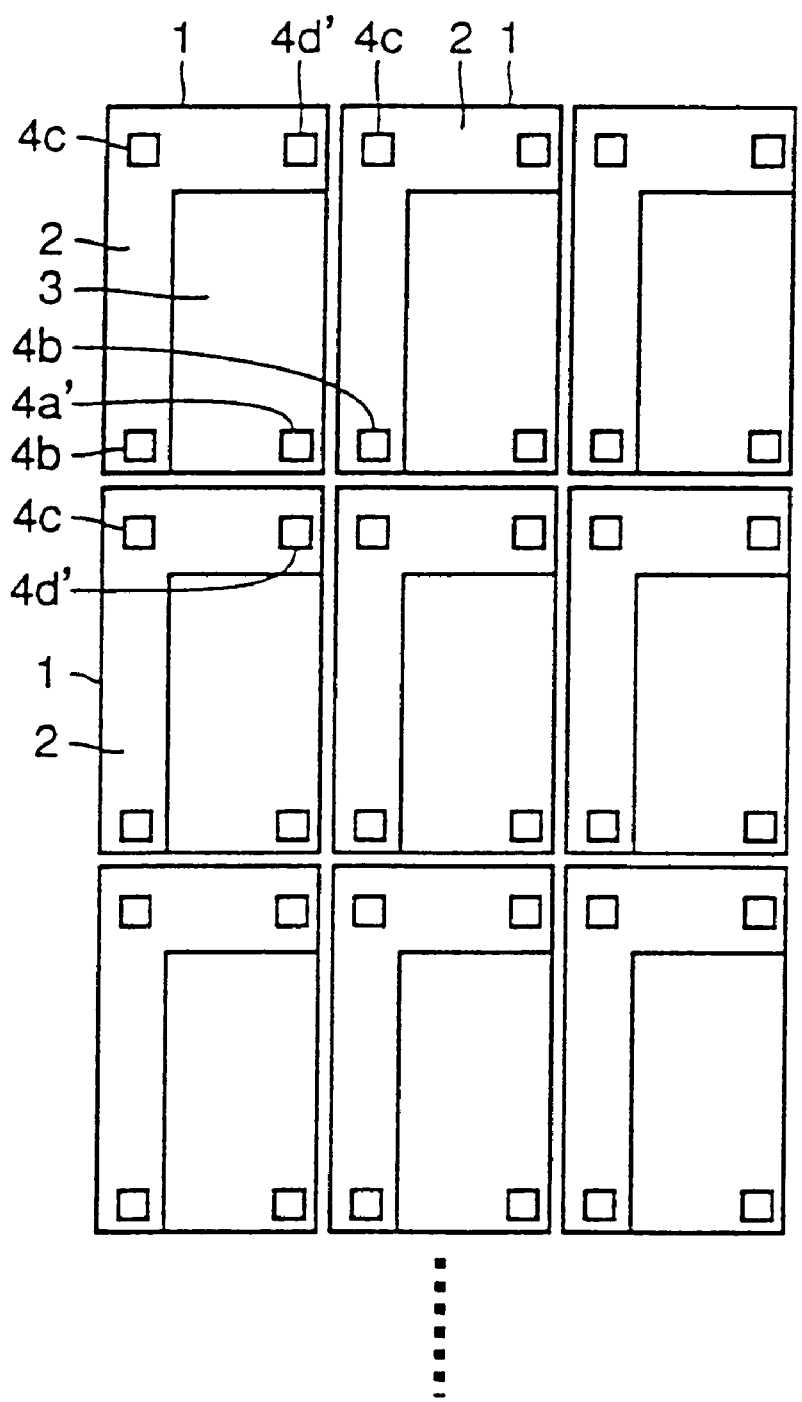
FIG. 2 is a plan view showing an arrangement of a plurality of shot regions one of which is shown in FIG. 1.
Figure 3:
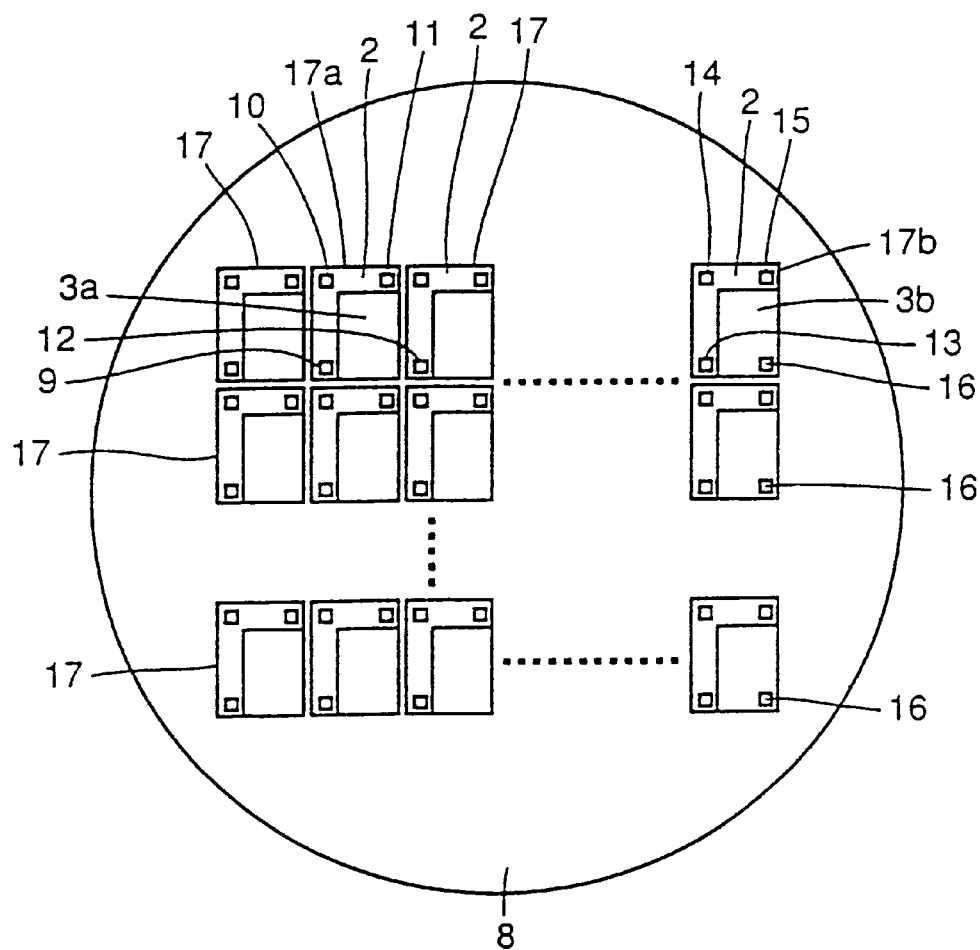
FIG. 3 is a plan view showing an arrangement of alignment marks according to a second embodiment of the present invention.

Referring to FIGS. 1–3, embodiments of the present invention will now be described.

First Embodiment

Referring now to FIGS. 1 and 2, a first embodiment of the present invention will be described. FIG. 1 is a plan view showing an arrangement of alignment marks according to the first embodiment of the present invention. Referring to FIG. 1, provided within a shot region 1 for a stepper are a device region 3 for forming a semiconductor device therein, and a dicing region 2 for dicing. The peripheral edge portion of shot region 1 is defined by a portion of the peripheral edge portion of device region 3 and a portion of the peripheral edge portion of dicing region 2. More specifically, device region 3 and shot region 1 each have a quadrangular, planar shape, two adjacent sides of device region 3 overlap first and second sides 6a and 6b of shot region 1, and a portion of the peripheral edge portion of dicing region 2 overlaps third and fourth sides 6c and 6d of shot region 1.

Figure 4A:
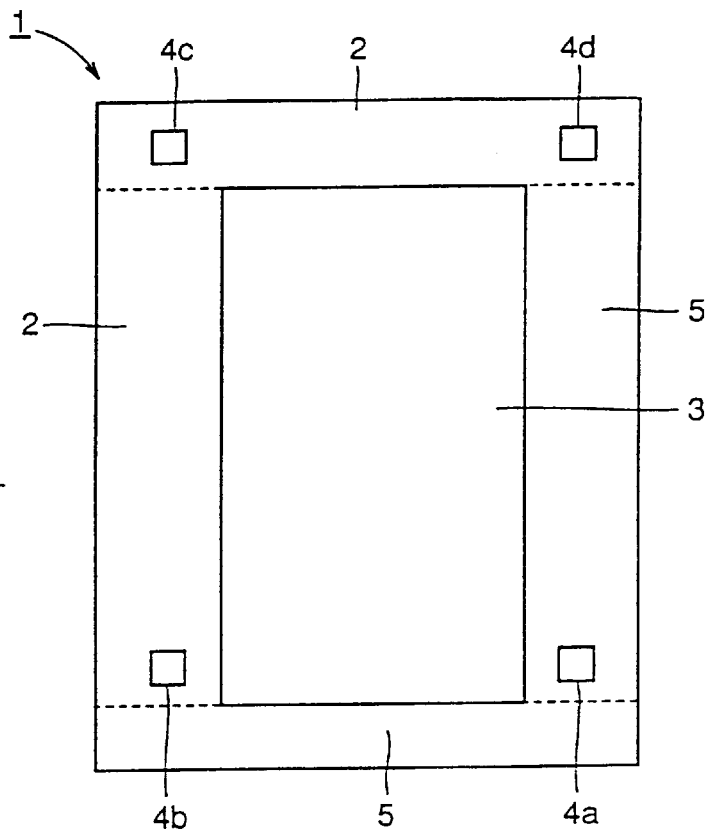
FIG. 4A is a plan view showing an example of a conventional arrangement of alignment marks for alignment of a stepper.

Dicing region 2 extends along sides other than the above two sides of device region 3. That is, dicing region 2 is selectively provided along the peripheral edge portion of device region 3 within shot region 1. Thus, the region other than device region 3 can be reduced within one shot region 1 as compared with a conventional example shown in FIG. 4A. Consequently, the number of the devices produced per wafer can be increased.

One alignment mark 4a' is provided within device region 3 thus arranged near a first corner 7a of shot region 1. Furthermore, three alignment marks 4b, 4c and 4d' are provided within dicing region 2 near second, third and fourth corners 7b, 7c and 7d of shot region 1. As the four alignment marks are thus provided, highly precise alignment can be achieved.

The first side 6a is preferably parallel to the third side 6c of shot region 1, an imaginary line segment joining alignment marks 4a' and 4d' is preferably parallel to the first side 6a, and an imaginary line segment joining alignment marks 4b and 4c is preferably parallel to the third side 6c. The imaginary line segment joining alignment marks 4a' and 4d' extends over dicing region 2 and device region 3, and the imaginary line segment joining alignment marks 4b and 4c extends only over dicing region 2.

Figure 4B:
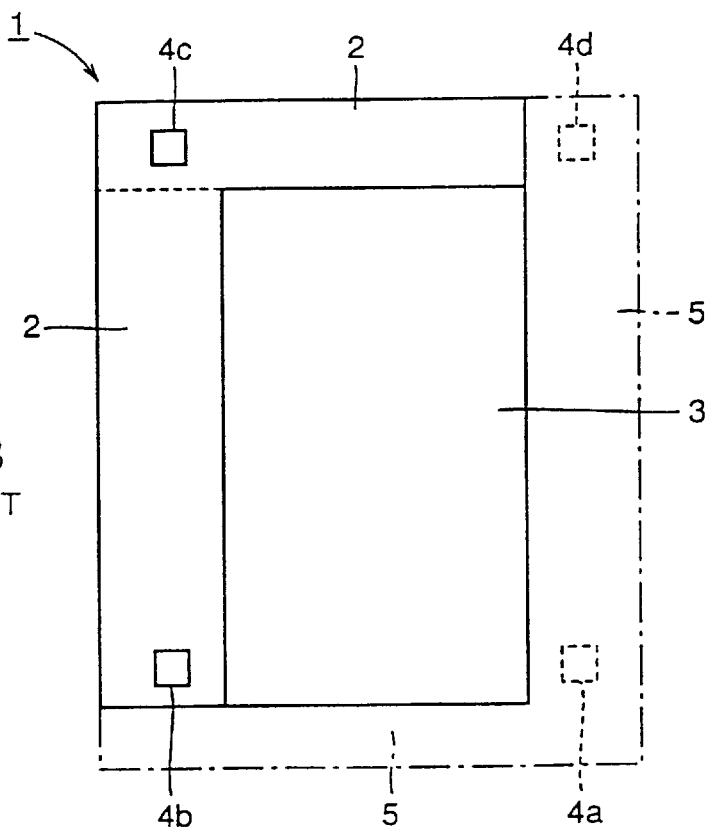
FIG. 4B is a plane view in which a TEG region in Fig. 4A is removed.

An improvement to be noted in the present invention is that a peripheral edge portion of shot region 1 is defined using a peripheral edge portion of device region 3. Thus, shot region 1 can be reduced as compared with a conventional shot region 1 shown in FIG. 4A. Alignment marks 4a', 4b, 4c and 4d' are provided preferably at positions which are in point symmetry with respect to the center of shot region 1. When the concept of reducing shot region 1 is not applied, four alignment marks cannot be provided within shot region 1 as shown in FIG. 4B.

On the other hand, in the example shown in FIG. 1, since shot region 1 itself is reduced, four alignment marks 4a', 4b, 4c and 4d' can be provided at positions which are in point symmetry with respect to the center of shot region 1. Thus, the number of the devices manufactured per wafer can be increased without degrading precision of alignment.

Referring now to FIG. 2, an example in which a plurality of shot regions 1 are arranged according to the present invention will be described. FIG. 2 is a plan view in which a plurality of shot regions 1 are arranged. Dicing regions 2 within other shot regions 1 are arranged adjacent to device region 3. Alignment marks 4b, 4c and 4d' or the like are also provided within the dicing regions 2 within the above other shot regions 1. That is, one device region is surrounded by dicing regions 2 belonging to a plurality of shot regions 1. A gap between shot regions 1 shown in FIG. 2 may be omitted.

Second Embodiment

Referring to FIG. 3, a second embodiment of the present invention will now be described. FIG. 3 is a plan view showing an arrangement of alignment marks according to the second embodiment of the present invention.

Referring to FIG. 3, a plurality of regions 17, 17a, 17b are provided on a semiconductor wafer 8. Provided within the plurality of regions 17, 17a, 17b are alignment marks 9, 10, 11, 12, 13, 14, 15, 16. Since alignment is not required to be as precise as that in the first embodiment in laser trimming, alignment marks 9, 10, 11 and 12 can be used, for example, when laser trimming is performed within a device region 3a within region 17a. That is, alignment marks 12 within an adjacent another region 17 can be used. Thus, additional alignment marks need not be formed within the device region in each of regions 17 and 17a as is in the first embodiment.

However, for region 17b located at the very end in FIG. 3, since another region 17 does not exist on the right side of region 17b, an alignment mark within the above mentioned another region 17 cannot be used. Thus, alignment mark 16 is selectively provided within a device region 3b in the region 17b located at the very end. This allows relatively highly precise alignment even within region 17b located at the very end in laser trimming, as is in the other regions 17 and 17a.

According to one aspect of the present invention, as described above, since a portion of the peripheral edge portion of a device region is defined using a portion of the peripheral edge portion of a shot region, the shot region can be reduced as compared with conventional examples. In addition, four alignment marks can be provided in the reduced shot region. Thus, the number of the devices manufactured per wafer can be increased while high precision of alignment of a stepper can be maintained.

Furthermore, when the shot region and the device region each have a quadrangular, planar shape, the device region may be arranged such that two adjacent sides of the device region overlap adjacent first and second sides of the shot region, respectively. Thus, a region within one shot region that surrounds the device region can be reduced as compared with conventional examples.

Furthermore, since first and third alignment marks are arranged at positions which are in point symmetry with respect to the center of the shot region and second and fourth alignment marks are arranged at positions which are in point symmetry with respect to the center of the shot region, more highly precise alignment of a stepper can be achieved.

In a method of arranging alignment marks according to another aspect of the present invention, a first alignment mark used for laser trimming is selectively provided only within the device region in a region located at the very end. Furthermore, second, third and fourth alignment marks are provided, spaced apart from one another, within the dicing region in the region located at the very end. This allows highly precise alignment in laser trimming, using the first to fourth alignment marks. In the present aspect also, similar to the above mentioned one aspect, since the device region is arranged to define a portion of the peripheral edge portion of one region, the number of the devices manufactured per wafer can be increased.

Furthermore, when the region and the device region each have a quadrangular, planar shape, two adjacent sides of the device region are preferably arranged to overlap adjacent first and second sides of the region, respectively. Thus, the area of the portion surrounding the device region in one region can be reduced as compared with conventional examples, and a number of regions can be provided on a single wafer. Consequently, the number of the devices manufactured per wafer can be increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of arranging alignment marks formed on a semiconductor wafer comprising:

forming a plurality of adjacent shot regions on said semiconductor wafer, each of said plurality of shot regions including a device region for forming a semiconductor device within said device region, and a dicing region provided around said device region for dicing, wherein:

said device region is arranged within each of said plurality of adjacent shot regions such that a portion of a first peripheral edge of said device region defines a portion of a second peripheral edge of a respective one of said plurality of adjacent shot regions;

said plurality of adjacent shot regions include an end shot region located at a terminal end of said plurality of adjacent shot regions such that said end shot region has a section of a device region that is not located adjacent a dicing region of another of said plurality of adjacent shot regions, said device region of said end shot region including a first alignment mark used for laser trimming; and said end shot region includes a dicing region having second, third and fourth alignment marks used for laser trimming, said second, third, and fourth alignment marks being spaced apart from one another.

2. The method of arranging alignment marks according to claim 1, wherein:

said end shot region and said device region therein each have a quadrangular, planar shape;

said device region is arranged such that two adjacent sides of said device region overlap adjacent first and second sides of said end shot region, respectively;

said first alignment mark is arranged within said device region near a first corner portion of said end shot region defined by said first and second sides;

said dicing region extends along sides other than said two adjacent sides of said device region; and said second, third and fourth alignment marks are arranged within said dicing region near second, third and fourth corner portions of said end shot region, respectively.

3. A wafer structure for a semiconductor device manufacturing process, comprising a plurality of adjacent shot regions on a semiconductor wafer, each of said plurality of shot regions including a device region for forming a semiconductor device within said device region, and a dicing region provided around said device region for dicing, wherein:

said device region is arranged within each of said plurality of adjacent shot regions such that a portion of a first peripheral edge of said device region defines a portion of a second peripheral edge of a respective one of said plurality of adjacent shot regions, and said plurality of adjacent shot regions includes an end shot region located at a terminal end of said plurality of adjacent shot regions such that said end shot region has a section of a device region that is not located adjacent a dicing region of another of said plurality of adjacent shot regions, said device region of said end shot region including a first alignment mark used for laser trimming, said end shot region including a dicing region having second, third and fourth alignment marks used for laser trimming, said second, third, and fourth alignment marks being spaced apart from one another.

4. The wafer structure for a semiconductor device manufacturing process according to claim 3, wherein:

said end shot region and said device region therein each have a quadrangular, planar shape;

said device region is arranged such that two adjacent sides of said device region overlap adjacent first and second sides of said end shot region, respectively;

said first alignment mark is arranged within said device region near a first corner portion of said end shot region defined by said first and second sides;

said dicing region extends along sides other than said two adjacent sides of said device region; and said second, third and fourth alignment marks are arranged within said dicing region near second, third and fourth corner portions of said end shot region, respectively.

5. The wafer structure for a semiconductor device manufacturing process according to claim 4, wherein:

each of said plurality of adjacent shot regions, excluding said end shot region, include at least three alignment marks arranged within said dicing region.

6. A wafer structure for a semiconductor device manufacturing process, comprising:

a first shot region on a semiconductor wafer, said first shot region including a device region and a dicing region, said first shot region having a first peripheral portion coextensive with a second peripheral portion of said device region thereof; and a second shot region on said semiconductor wafer, said second shot region including a device region and a dicing region, said second shot region having a first peripheral portion coextensive with a second peripheral portion of said device region thereof, said second shot region being located adjacent said first shot region such that a portion of said first peripheral portion of said second shot region defines a portion of a peripheral edge of said first shot region, wherein said device region of said first shot region includes a first alignment mark and said dicing region of said first shot region includes a second alignment mark, a third alignment mark, and a fourth alignment mark.

7. The wafer structure for a semiconductor device manufacturing process according to claim 6, wherein said dicing region of said second shot region includes a first alignment mark, a second alignment mark, and a third alignment mark.

8. The wafer structure for a semiconductor device manufacturing process according to claim 6, wherein:

said first shot region and said device region therein each have a shape that is generally quadrangular, said second peripheral portion of said device region including two adjacent sides defining a first corner and being coextensive with said first peripheral portion of said first shot region, said dicing region extending along two adjacent sides of said device region that are opposite said two adjacent sides coextensive with said first peripheral portion of said first shot region;

said first alignment mark is arranged within said device region of said first shot region proximate said first corner; and said second alignment mark, said third alignment mark, and said fourth alignment mark of said first shot region are arranged within said dicing region proximate a second corner, a third corner, and a fourth corner of said first shot region, respectively.

9. The wafer structure for a semiconductor device manufacturing process according to claim 8, wherein:

said second shot region and said device region therein each have a shape that is generally quadrangular, said second peripheral portion of said device region including two adjacent sides defining a first corner and being coextensive with said first peripheral portion of said second shot region, said dicing region extending along two adjacent sides of said device region that are opposite said two adjacent sides coextensive with said first peripheral portion of said second shot region;

said dicing region of said second shot region includes a first alignment mark, a second alignment mark, and a third alignment mark; and said first alignment mark, said second alignment mark, and said third alignment mark of said second shot region are arranged within said dicing region proximate a second corner, a third corner, and a fourth corner of said second shot region, respectively.

* * * * *